(12) United States Patent
Mohajeri et al.

(10) Patent No.: US 8,804,888 B2
(45) Date of Patent: Aug. 12, 2014

(54) WIDE BAND CLOCK DATA RECOVERY

(75) Inventors: Hessam Mohajeri, Los Altos Hills, CA (US); Bruno Tourette, Cupertino, CA (US); Emad Afifi, San Jose, CA (US)

(73) Assignee: Ensphere Solutions, Inc., Santa Clara, CA (US)

( * ) Notice: Subject to any disclaimer, the term of this patent is extended or adjusted under 35 U.S.C. 154(b) by 103 days.

(21) Appl. No.: 13/180,453

(22) Filed: Jul. 11, 2011

(65) Prior Publication Data

US 2012/0008727 A1  Jan. 12, 2012

Related U.S. Application Data

(60) Provisional application No. 61/363,539, filed on Jul. 12, 2010.

(51) Int. Cl.
*H04L 7/00* (2006.01)

(52) U.S. Cl.
USPC ........... 375/355; 375/294; 375/327; 375/360; 375/371; 375/375

(58) Field of Classification Search
USPC ......... 375/259, 293, 294, 316, 322, 327, 354, 375/355, 360, 369, 371, 373–376
See application file for complete search history.

(56) References Cited

U.S. PATENT DOCUMENTS

| | | | | |
|---|---|---|---|---|
| 7,457,391 B2 * | 11/2008 | Gregorius et al. | ............ | 375/373 |
| 7,561,653 B2 * | 7/2009 | Sindalovsky et al. | ......... | 375/373 |
| 7,605,663 B2 * | 10/2009 | Cheng et al. | ..................... | 331/16 |
| 7,630,466 B2 * | 12/2009 | Momtaz et al. | ............... | 375/350 |
| 7,672,417 B2 * | 3/2010 | Si et al. | .......................... | 375/375 |
| 7,719,375 B2 * | 5/2010 | Cho et al. | .................. | 331/177 V |
| 8,395,446 B1 * | 3/2013 | Tran | .............................. | 330/254 |
| 8,634,509 B2 * | 1/2014 | Crain et al. | .................... | 375/355 |
| 2007/0168770 A1 * | 7/2007 | Fan et al. | ....................... | 714/704 |
| 2008/0320324 A1 * | 12/2008 | Ke et al. | ......................... | 713/401 |
| 2009/0290672 A1 * | 11/2009 | Ho | ................................ | 375/374 |
| 2011/0228889 A1 * | 9/2011 | Liu et al. | ....................... | 375/376 |
| 2011/0249519 A1 * | 10/2011 | Tamura | .................... | 365/189.15 |
| 2013/0093433 A1 * | 4/2013 | Lee et al. | ...................... | 324/614 |

OTHER PUBLICATIONS

Dalton, Declan et al., "A 12.5-Mb/s to 2.7-Gb/s Continuous-Rate CDR With Automatic Frequency Acquisition and Data-Rate Readback," IEEE Journal of Solid-State Circuits, vol. 40, No. 12, Dec. 2005, pp. 2713-2725.
Rodoni, Lucio et al., "A 5.75 to 44 Gb/s Quarter Rate CDR With Data Rate Selection in 90 nm Bulk CMOS," IEEE Journal of Solid-State Circuits, vol. 44, No. 7, Jul. 2009, pp. 1927-1941.
Tontisirin, S. et al., "2.5 Gbps Clock Data Recovery Using $1/4^{th}$-Rate Quadricorrelator Frequency Detector and Skew-Calibrated Multi-Phase Clock Generator," Advances in Radio Science, vol. 4, 2006, pp. 287-291.
Wu, Lin et al., "A Low-Jitter Skew-Calibrated Multi-Phase Clock Generator for Time-Interleaved Applications," IEEE International Solid-State Circuits Conference—Session 25, Feb. 2001, 3 pgs.

* cited by examiner

*Primary Examiner* — Hirdepal Singh
(74) *Attorney, Agent, or Firm* — Bingham McCutchen LLP

(57) ABSTRACT

The present disclosure provides a clock data recovery circuit that includes a phase locked loop unit, a delay locked loop unit and digital clock data recovery unit. The phase locked loop unit generates a clock signal based on a reference signal. The delay locked loop unit receives the clock signal from the phase locked loop, divides the clock signal into a plurality of clock signals and outputs the clock signals. The digital clock data recovery unit receives an input current signal, estimates a frequency of the input current signal, outputs a reference signal having the frequency, which can be transmitted to the phase locked loop unit, receives the clock signals from the delay locked loop, aligns a phase of the input current signal based on the clock signals and outputs an aligned current signal.

11 Claims, 9 Drawing Sheets

WIDE BAND CLOCK DATA RECOVERY

CROSS REFERENCE TO RELATED APPLICATIONS

This application claims priority to provisional application No. 61/363,539, filed Jul. 12, 2010, which is incorporated in its entirety by reference herein.

FIELD OF THE INVENTION

The present disclosure relates generally to apparatuses and methods for clock data recovery.

BACKGROUND

Data transmitted across a high speed system, such as between two chips on a highly integrated system or between circuits within a single chip, are typically sent without an accompanying clock signal. Due to limited bandwidth and other reasons, the data are frequently distorted during the transmission. Therefore, although the use of the clockless data reduces the complexity, power consumption and cost on sending side, it requires the receiving side to generate a clock signal to recover the distorted data. A clock data recovery (CDR) device that stably creates signal in synchronization with the received data is therefore important to ensure the quality of high speed data communication.

SUMMARY

The present disclosure provides, in one embodiment, a clock data recovery circuit comprising a phase locked loop unit for generating a clock signal based on a first reference data signal; a delay locked loop unit for receiving the clock signal from the phase locked loop, dividing the clock signal into a plurality of clock signals and outputting the plurality of clock signals; and a digital clock data recovery unit for receiving an input current signal, estimating a frequency of the input current signal, outputting a second reference data signal having the frequency to the phase locked loop unit, receiving the plurality of clock signals from the delay locked loop, aligning a phase of the input current signal based on the plurality of clock signals and outputting an aligned current signal. In some aspects, the second reference data signal is the first reference data signal.

In one embodiment, the phase locked loop unit comprises a charge pump, a voltage-controlled oscillator and a frequency divider. In another embodiment, the phase locked loop unit further comprises a charge pump comparator.

In one embodiment, the delay locked loop unit comprises a phase detector, a loop filter and a voltage controlled delay line. In another embodiment, the digital clock data recovery unit comprises a phase/frequency detector, a sampler, a phase alignment unit, an edge detector, a phase rotator, an up/down counter and a digital loop filter. In some aspects, the phase/frequency detector is configured to initiate from the lowest possible clock frequency.

In one embodiment, the clock data recovery circuit further comprises a programmable equalizer for equalizing the input current signal before it is received by the digital current data recovery unit.

In one embodiment, the clock data recovery circuit further comprises a first in first out buffer for receiving the aligned current signal from the digital current data recovery unit, a pseudorandom binary sequence generator or a pseudorandom binary sequence checker.

In one aspect of any of the above embodiments, the clock data recovery circuit is configured to correct a current signal having a frequency from about 2.5 gigahertz to about 30 gigahertz.

In one aspect of any of the above embodiments, the clock data recovery is configured to recover clock from an input current signal that is clockless.

Other features and aspects of the present disclosure will become apparent to those skilled in the art upon review of the following detailed description, claims and drawings.

BRIEF DESCRIPTION OF THE DRAWINGS

In the drawings, wherein like reference numerals indicate like parts.

Figure 1A:
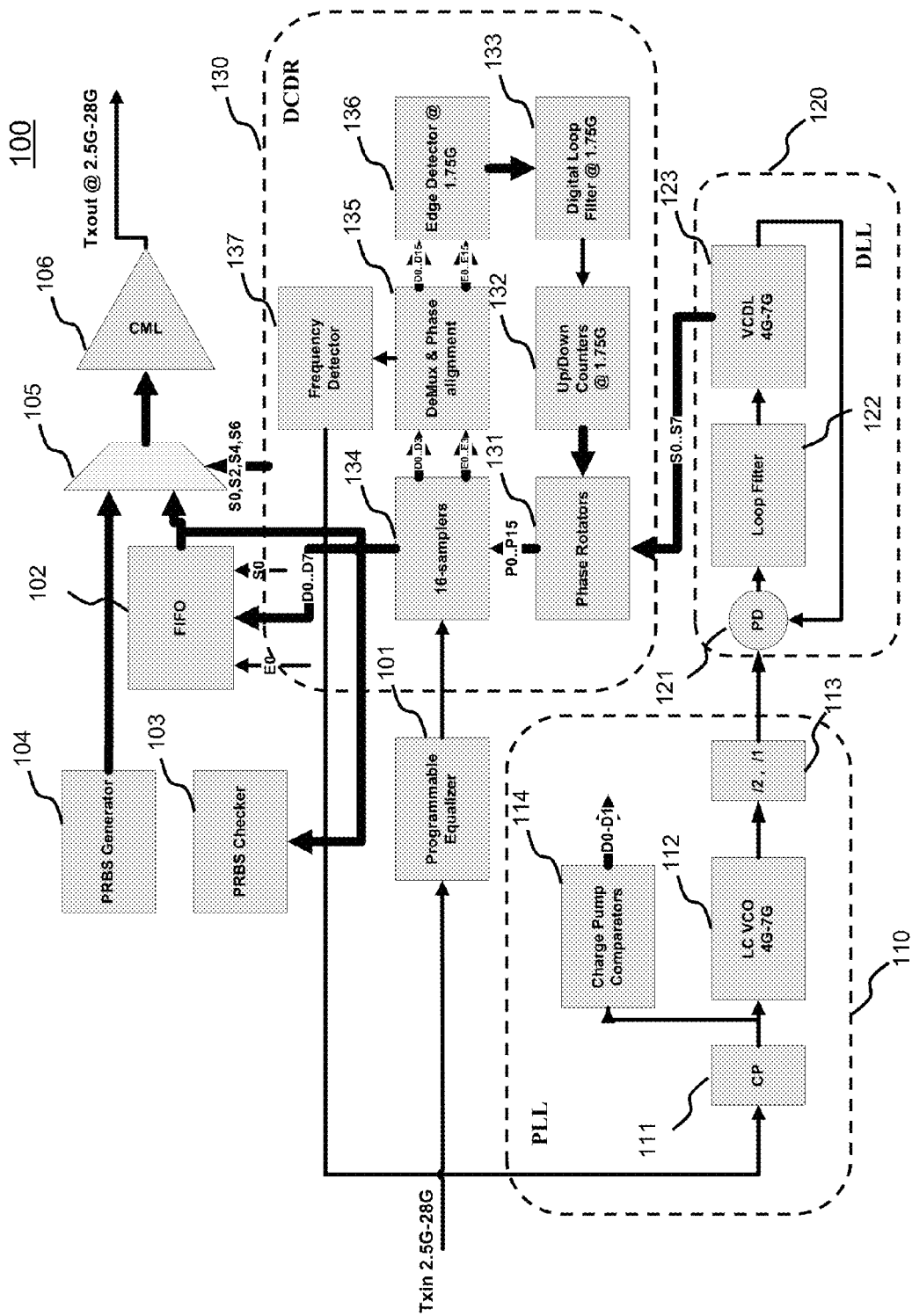
FIG. 1A is a block diagram illustrating a digital signal process based retimer using LC generator architecture according to one embodiment of the present technology.

Before any features of the disclosure are explained in detail, it is to be understood that the disclosure is not limited in its application to the details of construction and the arrangements of the components set forth in the following description or illustrated in the drawings. The disclosure is capable of other embodiments and of being practiced or being carried out in various ways. Also, it is understood that the phraseology and terminology used herein is for the purpose of description and should not be regarded as limiting. The use of "including", "having", and "comprising" and variations thereof herein is meant to encompass the items listed thereafter and equivalents thereof as well as additional items. The use of letters to identify elements of a method or process is simply for identification and is not meant to indicate that the elements should be performed in a particular order.

DETAILED DESCRIPTION

A conventional clock data recovery (CDR) has a limited pull-in range of few thousand ppm frequency error while more than one decade of frequency range may be required on certain high perform circuits. Additionally, the conventional CDR does not adjust its loop dynamics automatically so that it lacks loop stability for wide range of data-rates. Lack of reference clock during high speed data transmission, further, makes it more difficult to estimate the data rate.

The present disclosure provides architectural solutions for a wideband clock data recovery (CDR) that does not require a reference clock and can cover data rates in the range of 1-30 Gbps or higher. As used herein, data without a reference clock is also referred to as "clockless data". By using digital signal processing (DSP) techniques and complementary metal-oxide-semiconductor (CMOS) processes, the present technology can achieve high performance for high speed data communication at low power.

Another advantage of the architectural solutions provided in the present disclosure is that the CDR can adapt to the input data rate automatically without any special programming. This CDR can be used in optical modules such as small form factor pluggable transceiver (SFP+), etc. Such modules are typically clock rate agnostic and the manufacturers usually design such modules to cover rates from 1 G to 16 G and higher. At such high rates, however, a CDR and equalizers are required so the attenuation and losses in the copper traces can be compensated. Conventional CDR, however, can not be used in such architecture since they can only support one rate only. It is, therefore, highly desirable for the module makers to have a device, such as what is provided in various embodiments of the present disclosure, which can automatically detect the rate from incoming data and adjust to it.

With reference to FIG. 1A, in one embodiment, the present disclosure provides a clock data recovery circuit 100 that includes a phase locked loop (PLL) unit 110, a delay locked loop (DLL) unit 120 and digital clock data recovery (DCDR) unit 130.

Figure 1B:
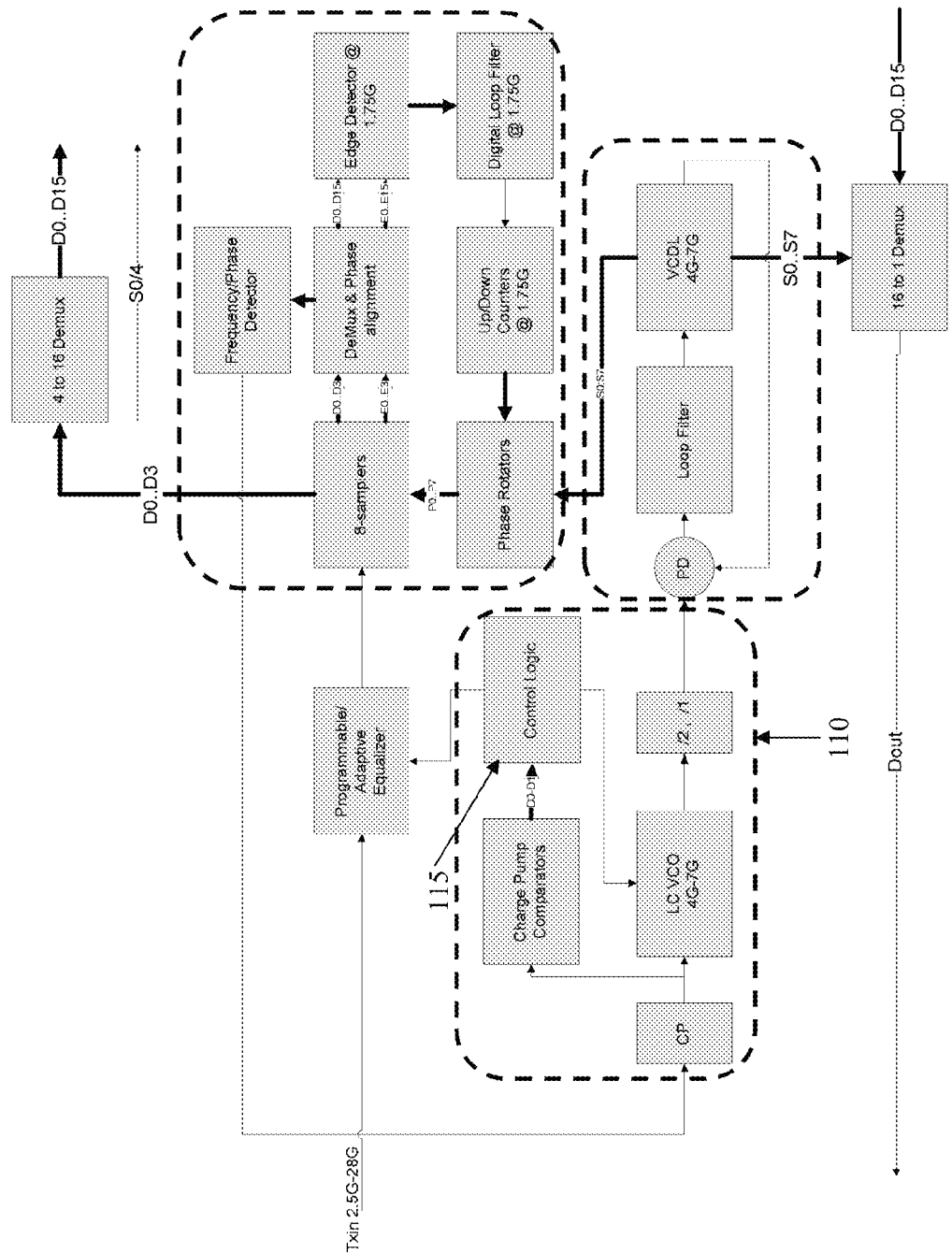
FIG. 1B is a block diagram illustrating a SERDES configuration according to another embodiment of the present technology for clockless data recovery.

The PLL unit can generate an output clock signal whose phase is related to the phase of an input reference data signal. In one embodiment, the PLL unit includes a charge pump (CP) 111, a voltage-controlled oscillator (VCO) 112 and/or a frequency divider 113. The CP receives a reference data signal as input and generates a signal to the VCO for creating a clock signal. In some aspects, the VCO is an inductor capacitor voltage-controlled oscillator (LC VCO). The PLL unit compares the phase of the input reference signal with the clock signal derived from the VCO and adjusts the frequency of the VCO to keep the phases matched. In one embodiment, the PLL unit further includes a charge pump comparator 114. In one aspect, the charge comparator can move the VCO frequency. In a preferred embodiment, this voltage is kept in the middle so as to make sure over the temperature variation the VCO can track and this voltage does not saturate and loop runs out of lock. The state machine uses the signals from the comparators to detect whether the loop has run out of lock or not. This signal can also be used during the initial phase for the lock detection with conjunction with other signals. In some embodiments, the PLL unit may further include a control logic 115, as shown in FIG. 1B.

For the purpose of illustration, the PLL unit locks into the incoming data signal and creates an estimate of phase/frequency. In order to support wide band data rate range, the phase/frequency detection can be done in multiple steps.

The DLL unit 120 receives the clock signals generated from the PLL unit 110 as input and divides the phase of the clock signal so as to generate a plurality of clock signals and then outputs the clock signals. In one embodiment, the DLL unit includes one or more of a phase detector 121, a loop filter 122 or voltage controlled delay line (VCDL) 123. The DLL circuit may be calibrated to make sure the phase mismatch among the clock phases are within the prescribed limit for the application.

A loop filter can be an analog loop filter. Analog loops are known in the art. The PLL unit 110 and the delay line 123 can both use a traditional analog loop filtering. The PLL bandwidth, in one embodiment, is as low as possible so as to clean up the jittery input clock. The DLL unit 120, however, in some embodiments, is a high bandwidth since the DLL unit needs to create a low jitter clock.

Figure 1C:
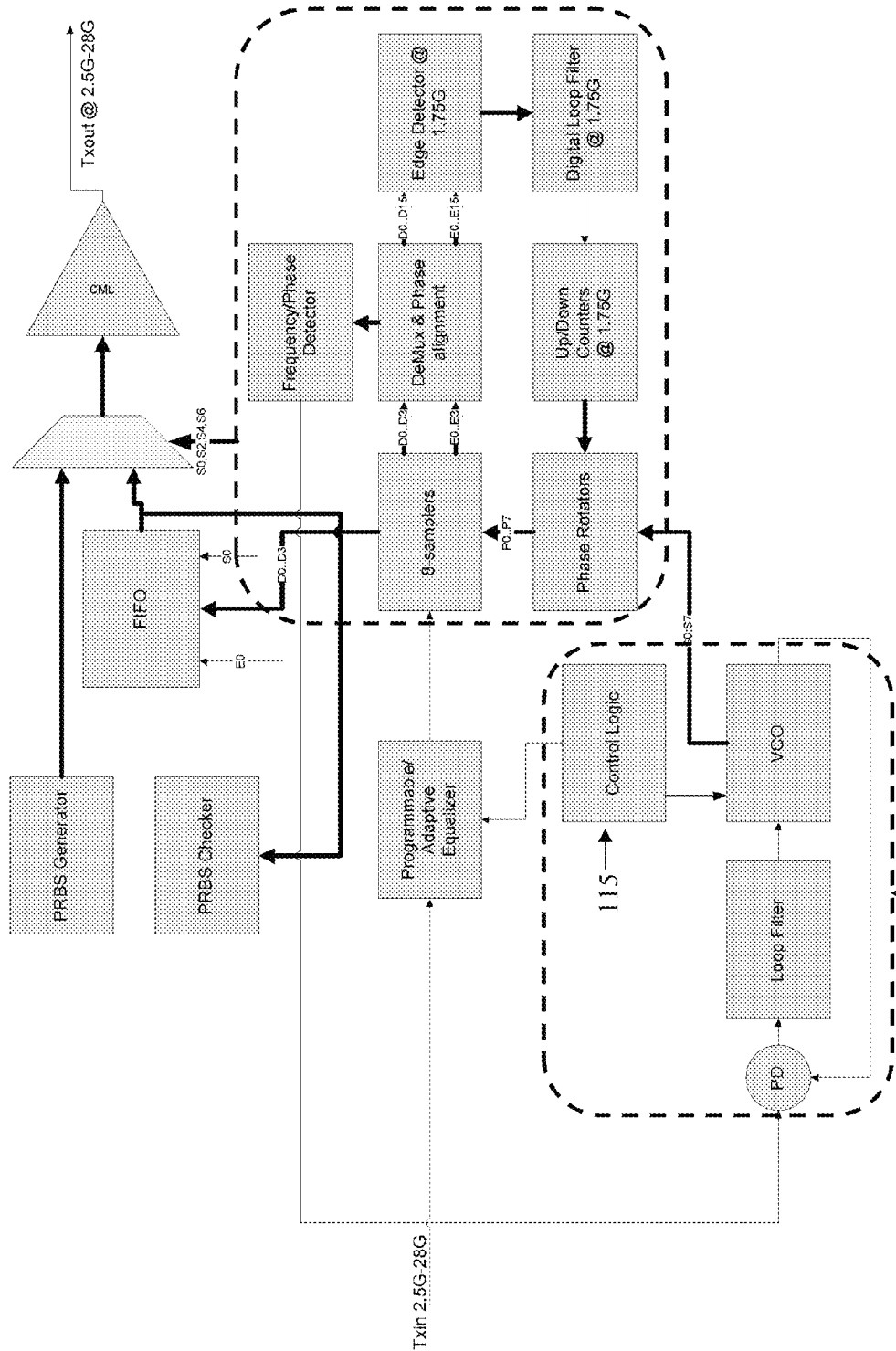
FIG. 1C is a block diagram illustrating a retimer using phase locked loop as a clock generator according to another embodiment of the present technology.

In some embodiments, the units 110 and 120 may be replaced by a PLL unit 140, as illustrated in FIG. 1C, which includes a phase detector 141, a loop filter 142 and a voltage controlled oscillator 143. In some embodiments, the PLL unit 140 may further comprise a control logic 144.

Figure 2:
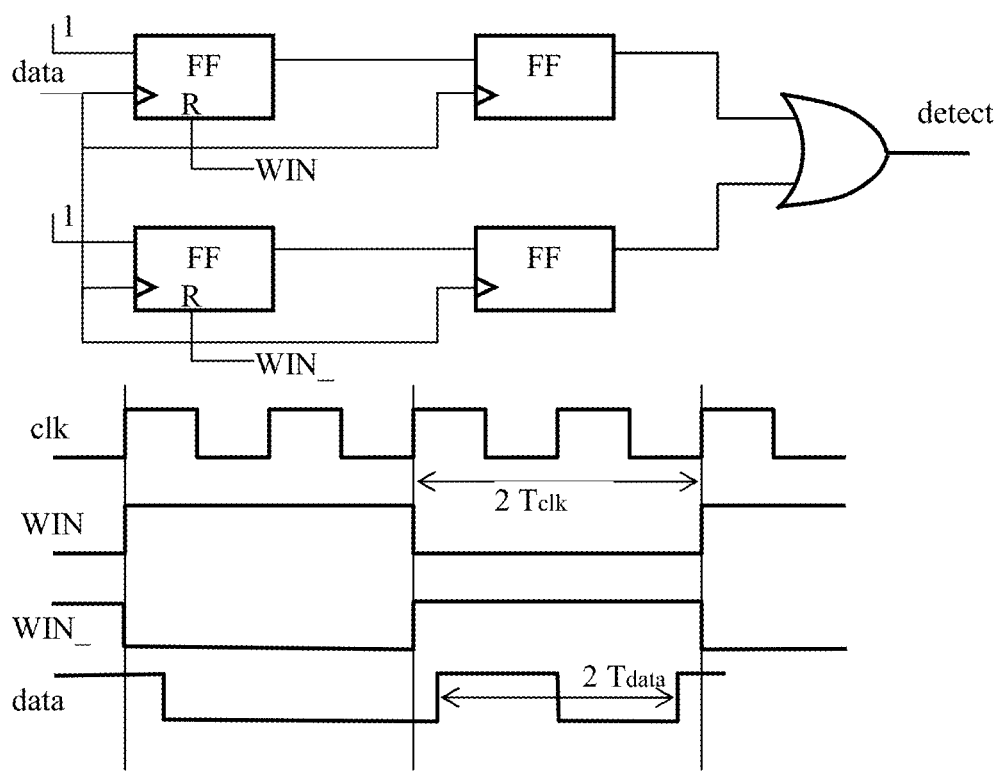
FIG. 2 is a diagram showing an exemplary coarse phase/frequency detector.

In one embodiment, the first step of the phase/frequency detection is coarse phase/frequency detection. In the coarse phase/frequency detection, the VCO and divider are initialized to start from the lowest possible clock frequency. This ensures that the clock frequency is lower than the data rate. The divider value and the VCO coarse frequency control (cap bank) are used to increase the clock frequency gradually till the fast frequency detector indicates that clock frequency is higher than data rate. This phase/frequency detector is based on flip flips clocked by the non-return-to-zero (NRZ) data to detect two positive NRZ edges within two clock cycles as shown in FIG. 2. This is an indication that clock frequency is lower than the data rate. As illustrated in FIG. 2, in the coarse phase/frequency detection, it is checked whether the data signal has more than one transition during one clock period. If more than one transition during one clock period is detected, then the clock is too slow and the device needs to speed up the VCO.

This fast phase/frequency detection may be susceptible to jitter and noise and it can practically estimate the frequency only within 10% accuracy. Also this method counts on the positive edge of the data being aligned to the positive edge of the clock in order to have high accuracy which require monitoring the output for a long bit stream ~1000 bits in order to have very small probability of not missing the pulse.

The second step is to lock to the data with better frequency accuracy than 1000 ppm which is within the pull-in range of the conventional CDR. Any suitable circuit may be used to perform this second step. In some embodiments, a cycle slippage detector disclosed in Delcan et al., IEEE Journal of Solid-State Circuits, Vol. 40, No. 12, p. 2713-2725 (2005), which is incorporated herein in its entirety, may be used. During this step, for example, the clock signal can be divided in four sections. The circuit looks at the transitions in data signals and tries to estimate the frequency of the clock. For example, if the transition takes place in the first quadrant, then all the following transitions should happen in the first quadrant as well. If not, then the transition will happen in the second quadrant or the fourth quadrant. In the event the transition takes place in the second Quadrant, then the clock is too fast and needs to slow down. If, however, it happens in the fourth quadrant, then the clock is too slow and needs to speed up.

This detector divides the clock into four quadrants (using a 90 phase shifted clock), detects which quadrant current data edge lies at and then waits for the data edge to slip to determine if the frequency error is positive or negative. The time period it takes for slippage to happen is a good indication of the frequency error. For 250 ppm frequency error detection it can take up to 1000 clock cycles for slippage to occur. Averaging or repeated measurements can be used to reduce the effect of jitter. It is observed that this detector has a limited pull-in range smaller than 50% frequency error which is dependent on the data pattern, so it is possible to give the wrong output if it starts with large frequency error and/or the data has long runs without transitions. Accordingly, in one embodiment, repeated measurements are performed to prevent the detector from steering the VCO in the wrong direction. This detector also can show lock for clock frequency that is a harmonic of the data rate. Harmonic lock can be detected by monitoring the recovered data bits or by a circuit similar to the coarse phase/frequency detector that detects one rising and one falling data edges within two clock cycles. This will trigger often for the desired clock frequency and rarely or never for the harmonic lock.

This phase/frequency detector can be used for both coarse and fine tuning of the VCO. Fine tuning of the VCO will require using a charge pump to control the VCO very close to the desired voltage. In one embodiment, with reference to FIG. 1A, the CDR uses two charge pumps, one with phase/frequency detector 137 and the other for the phase detector 121. In some embodiments, the phase/frequency detector charge pump will be turned off after frequency lock is achieved, and the fine phase/frequency detector will also be used as a lock detector by monitoring cycle slippage.

Figure 3:
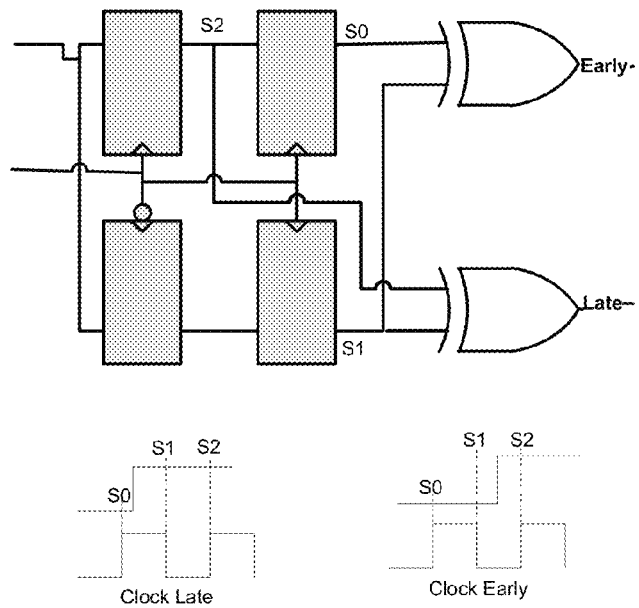
FIG. 3 is a diagram illustrating an Alexander phase detector.

In one embodiment, the phase detector 121 is an Alexander phase detector and it can use a digital loop for the data recovery and locking. When a digital loop is used, multiple CDRs can be included on the same chip and be able to recover the clock from multiple sources. FIG. 3 illustrates an Alexander phase detector that can be used for one embodiment of the present design. In FIG. 3, the exemplary Alexander phase detector samples the data three times during one period of clock.

At high speed, an Alexander phase detector may not function properly. Therefore, in one embodiment, parallel processing is adopted to extract the early and late phases. In one aspect, the parallel processing uses majority vote logic. An exemplary parallel Alexander phase detector is illustrated in FIG. 4 and explained below.

Figure 4:
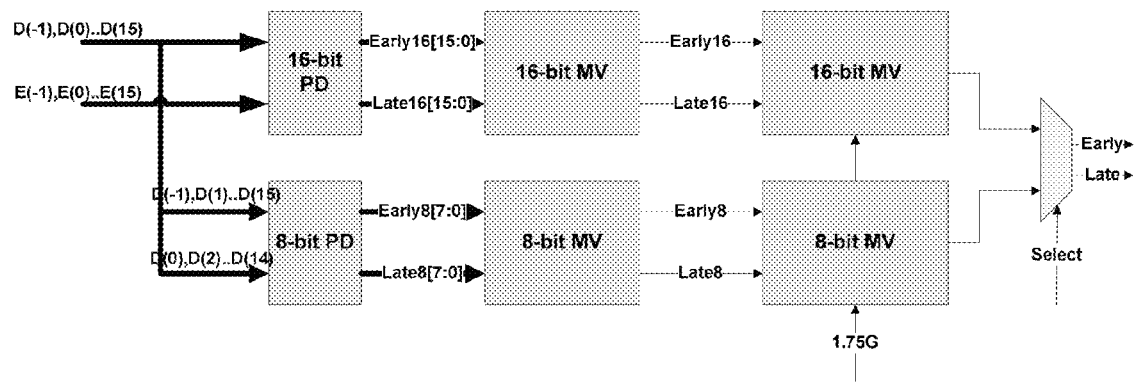
FIG. 4 is a diagram showing an exemplary parallel Alexander phase detector.

With reference to FIG. 4, the equation for the full rate phase detector is as follows:

$$\text{Early} = (D_n \neq D_{n-1}) \cdot (D_n \neq E_n)$$

$$\text{Later} = (D_n \neq D_{n-1}) \cdot (D_n = E_n)$$

And the half rate phase detector becomes:

$$\text{Early} = (D_n \neq D_{n-2}) \cdot (D_n \neq D_{n-1})$$

$$\text{Later} = (D_n \neq D_{n-2}) \cdot (D_n = D_{n-1})$$

The result of the phase detector is fed to the majority vote circuit and the result if passed to the output.

The VCDL 123 receives the clock signal from the PLL unit through the loop filter 122 and controls an amount of delay of the clock signal. Timing information between the reference data signal and the clock signal is produced by the phase detector 121. This information is inputted into the VCDL 123 via the loop filter 122 and the VCDL 123. The VCDL 123 then controls the clock signal in order to make the reference data signal match with the clock signal by delaying a clock signal based on the received timing information. By creating multiple delays of the clock signal, the VCDL generates a plurality of clock signals and then outputs these signals to the DCDR unit 130.

With reference to FIG. 1A again, the DCDR unit 130 receives an input current signal, which, in some embodiment, are clockless. In one embodiment, the input current signal comes from a circuit on a same chip as the CDR circuit. In another embodiment, the input current signal comes from a different chip in a same device, or from a device that is connected to the CDR circuit through a wire, a bus, or wireless communication. The DCDR unit can estimate a frequency of the input current signal and output a reference data signal having the frequency to the PLL unit 110. As provided above, the PLL unit takes the reference data signal and create a clock signal which is then divided by the DLL unit 120 into a series of delayed clock signals. The DCDR unit then receives the clock signals from the DLL unit and aligns input current signal based on the clock signals.

In one embodiment, with reference to FIG. 1A, the DCDR unit 130 includes one or more of a phase/frequency detector 137, a sampler 134, a phase alignment unit 135, an edge detector 136, a phase rotator 131, one or more up/down counters 132 or a digital loop filter 133.

Figure 5:
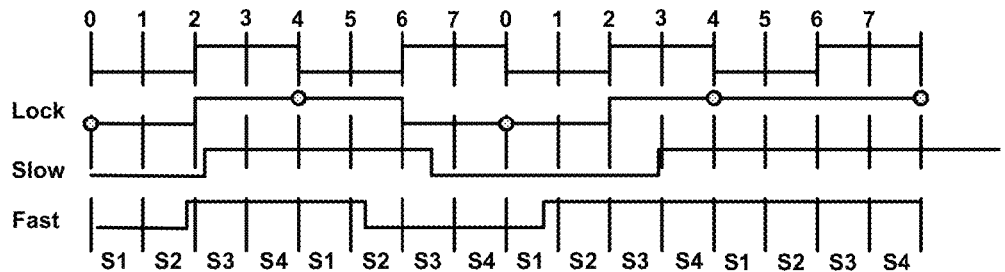
FIG. 5 is a circuit diagram illustrating a fine phase/frequency detector.
Figure 5:
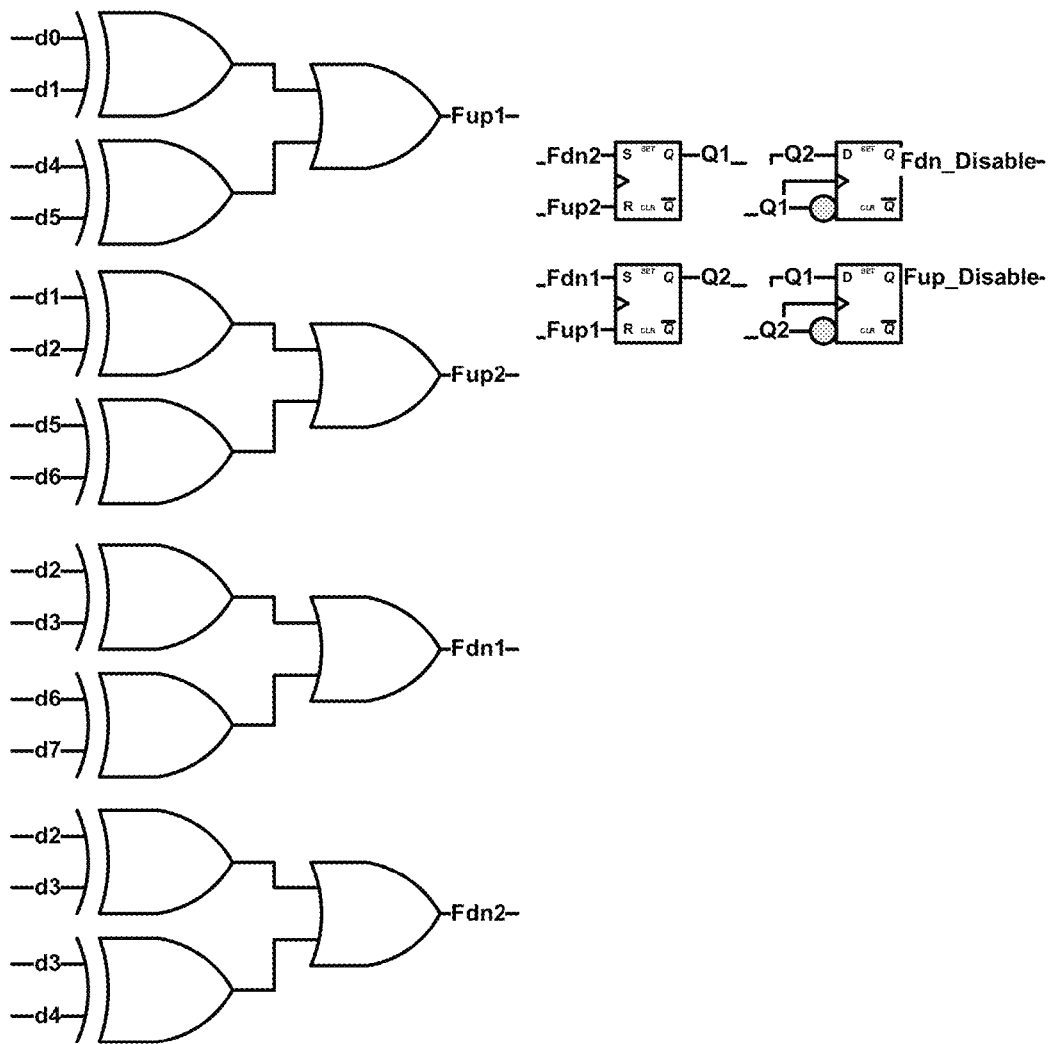

In one embodiment, the phase/frequency detector is a fine phase/frequency detector. The 16-bit data generated from the sampler and the edges detected from the edge detector can be used for detecting the frequency of the input signal and moving the VCO to the correct frequency. FIG. 5 illustrates how the frequency lock is achieved. The logic diagram in FIG. 5 is for detection of four bits at one time and it helps remove the noise and non-ideal effect in the system. In some embodiment, however, it is sufficient to use only one bit for frequency detection and based on that to correct for frequency shift. This parallel architecture is equivalent to the FIG. 2 diagram but is done in parallel. Once the frequency lock detector detects the frequency to be near the range, then the circuit switches to the digital phase detectors and keep the loop in lock.

The fine phase/frequency detector 137 can lock to the harmonics for the clock. It is helpful to detect if there is a pattern like 010, 101, 0101, 1010, etc that occurs in the received data. If this pattern does not happen in the data stream then it is likely that the harmonic lock has been achieved and a new frequency search is required.

The loss of lock and lock detect is achieved when the rotational frequency detector hunts in between up pulses and down pulses. A lock detect (LD) is achieved when the number of clocks in between frequency up and frequency down cycle are greater than 4000. In order to introduce hysteresis in the design, the loss of lock is flagged when the number of clocks in between up and down pulses are less than 1000.

Figure 6:
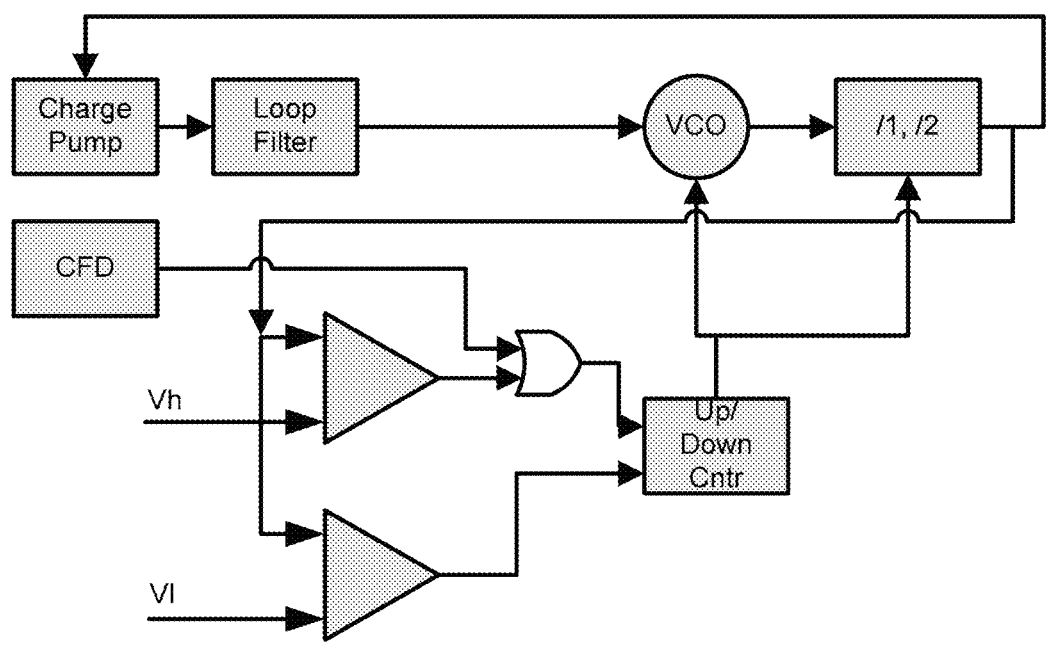
FIG. 6 is a diagram illustrating another coarse phase/frequency detector.

In one embodiment, the phase/frequency detector is a coarse phase/frequency detector (CFD). FIG. 6 illustrates a coarse phase/frequency detector suitable for the purpose. The coarse phase/frequency detector in FIG. 6 includes a charge pump, a loop filter, a voltage controlled oscillator, a divider and a up/down counter. Coarse phase/frequency detectors are based on the idea that data will transition twice in a clock period if the frequency is too low. The parallel phase/frequency detector can be used to detect the transition and increment the frequency. Once the coarse phase/frequency detector is settled and the VCO is in the vicinity of the desired frequency, then the CFD is shut down and the control is transferred to the fine phase/frequency detector.

In one embodiment, the CDR circuit may rely on a quarter rate of the bit rate and the matching of the four clock phases, to make sure that the clock mismatches are less than the peak of the jitter signal. The phase mismatch alignment can be performed during the test. Registers can be provided to tune out the static mismatch by analyzing the Root-Mean-Square Jitter.

In some embodiments, the clock data recovery circuit further includes a programmable equalizer 101 for equalizing the input current signal before it is received by the digital current data recovery unit, a first in first out buffer 102 for receiving the aligned current signal from the digital current data recovery unit, a pseudorandom binary sequence (PRBS) generator 104, a pseudorandom binary sequence (PRBS) checker 103, a self test unit 105, and/or a current mode logic (CML) 106 (FIG. 1A).

One advantage of extracting the bits to a lower rate is to enable PRBS checking. This can be an advantage for the users to do the checks and also improve the testing ability of the design. In one embodiment, the PRBS generator 104 is configured to do both 2^27−1 and also 2^7−1. For the PRBS to function properly the internal VCO can be free running and used as a clock source.

The PRBS generator 104 and checker 103 can be used to verify the operation of the chip in the system. While during the production, it is difficult to feed high speed signals to the chip. Therefore, the self test unit 105 is helpful because it allows the use of inexpensive testers to verify the operation of the chip before shipping to the customers.

Figure 7:
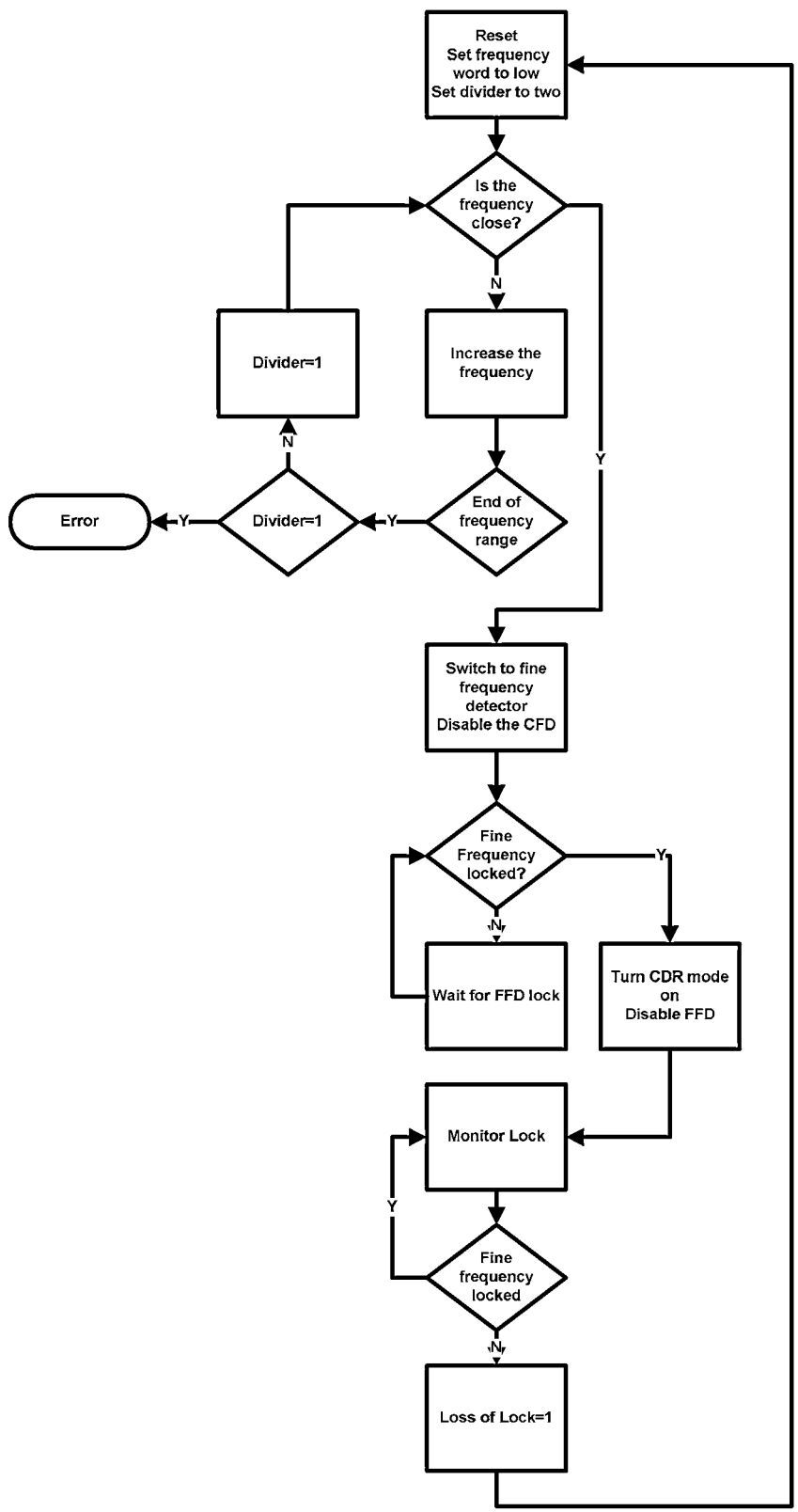
FIG. 7 is a flow chart for lock frequency state machine.

A number of control steps are helpful in managing all the units and make sure a proper sequence of events to take place in order for the CDR to lock and the device settles to the proper operation point. FIG. 7 shows a flow chart that describes, in some embodiment, the control flow needed for this loop to converge.

Figure 8:
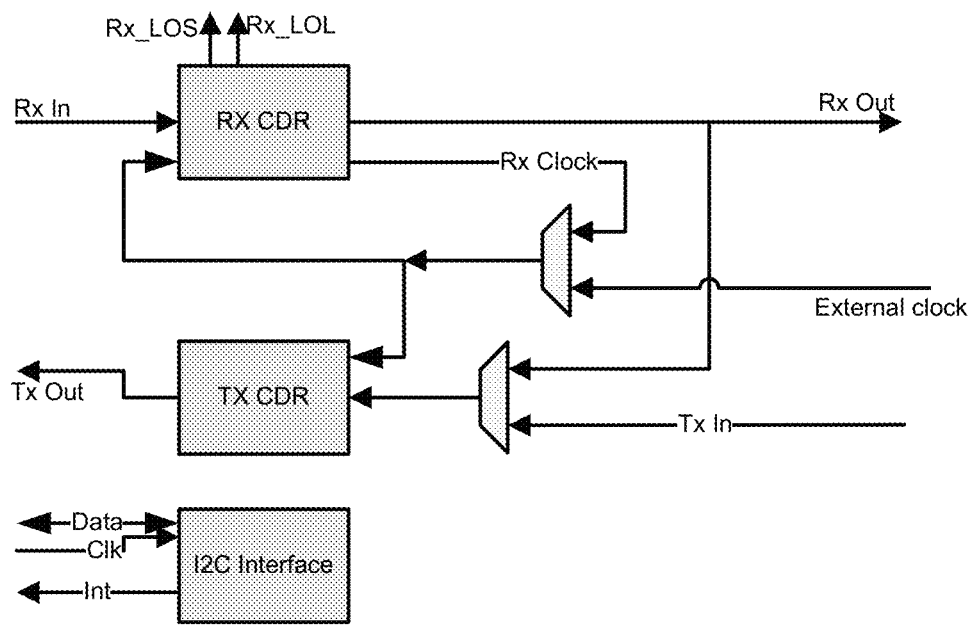
FIG. 8 is a functional block diagram of an exemplary complete chip.

FIG. 8 illustrates a functional block diagram that includes all the blocks and functions required for a complete chip in one embodiment of the current technology.

The CDR of the present disclosure can be configured to correct a current signal having a frequency from about 1 gigahertz to about 30 gigahertz, or to about 50 gigahertz, or to about 100 gigahertz or even higher. In one embodiment, the CDR is configured to correct a current signal having a frequency from about 1 gigahertz to about 30 gigahertz, or alternatively from about 2.5 gigahertz to about 30 gigahertz, or alternatively from about 5 gigahertz to about 30 gigahertz, or alternatively from about 10 gigahertz to about 30 gigahertz, or yet alternatively from about 20 gigahertz to about 30 gigahertz, or further alternatively from about 25 gigahertz to about 30 gigahertz.

In one embodiment, the supply voltage range for the circuit is 2.5V and 1.5V. Internal 1.0V supply for the digital logic and other potential voltages needs to be generated internally.

Any suitable process technology may be used to produce the above-described circuit. In a non-limiting example, TSMC 65 nm-G process with six layers of meta, twin well and MIM capacitors may be used.

This circuit may use CML logic on the high speed paths to capture the signal and also perform the high speed logic. The swing of high-speed internal logic is very important. The internal swing of the CML logics may be determined based on the power dissipation and swing levels required to overcome the internal offset of differential pairs.

Although the disclosure has been described in detail with reference to certain preferred embodiments, variations and modifications exist within the scope and spirit of the disclosure as described and defined in the following claims.

The invention claimed is:

1. A clock data recovery circuit comprising:
a phase locked loop unit for generating a clock signal based on a first reference data signal;
a delay locked loop unit for receiving the clock signal from the phase locked loop, dividing the clock signal into a plurality of clock signals and outputting the plurality of clock signals; and
a digital clock data recovery unit for receiving an input current signal, estimating a frequency of the input current signal, outputting a second reference data signal having the frequency to the phase locked loop unit, receiving the plurality of clock signals from the delay locked loop, aligning a phase of the input current signal based on the plurality of clock signals and outputting an aligned current signal,
wherein the second reference data signal is the first reference data signal.

2. The clock data recovery circuit of claim 1, wherein the phase locked loop unit comprises a charge pump, a voltage-controlled oscillator and a frequency divider.

3. The clock data recovery circuit of claim 1, wherein the delay locked loop unit comprises a phase detector, a loop filter and a voltage controlled delay line.

4. The clock data recovery circuit of claim 1, wherein the digital clock data recovery unit comprises a phase/frequency detector, a sampler, a phase alignment unit, an edge detector, a phase rotator, an up/down counter and a digital loop filter.

5. The clock data recovery circuit of claim 1, further comprising a programmable equalizer for equalizing the input current signal before it is received by the digital current data recovery unit.

6. The clock data recovery circuit of claim 1, further comprising a first in first out buffer for receiving the aligned current signal from the digital current data recovery unit, a pseudorandom binary sequence generator or a pseudorandom binary sequence checker.

7. The clock data recovery circuit of claim 1, wherein the clock data recovery circuit is configured to correct a current signal having a frequency from about 2.5 gigahertz to about 30 gigahertz.

8. The clock data recovery circuit of claim 1, wherein the input current signal is clockless.

9. A clock data recovery circuit comprising:
a phase locked loop unit for generating a clock signal based on a first reference data signal;
a delay locked loop unit for receiving the clock signal from the phase locked loop, dividing the clock signal into a plurality of clock signals and outputting the plurality of clock signals; and
a digital clock data recovery unit for receiving an input current signal, estimating a frequency of the input current signal, outputting a second reference data signal having the frequency to the phase locked loop unit, receiving the plurality of clock signals from the delay locked loop, aligning a phase of the input current signal based on the plurality of clock signals and outputting an aligned current signal,
wherein the phase locked loop unit comprises a charge pump, a voltage-controlled oscillator and a frequency divider, and
wherein the phase locked loop unit further comprises a charge pump comparator.

10. The clock data recovery circuit of claim 9, wherein the phase locked loop unit further comprises a control logic.

11. A clock data recovery circuit comprising:
a phase locked loop unit for generating a clock signal based on a first reference data signal;
a delay locked loop unit for receiving the clock signal from the phase locked loop, dividing the clock signal into a plurality of clock signals and outputting the plurality of clock signals; and
a digital clock data recovery unit for receiving an input current signal, estimating a frequency of the input current signal, outputting a second reference data signal having the frequency to the phase locked loop unit, receiving the plurality of clock signals from the delay locked loop, aligning a phase of the input current signal based on the plurality of clock signals and outputting an aligned current signal
wherein the digital clock data recovery unit comprises a phase/frequency detector, a sampler, a phase alignment unit, an edge detector, a phase rotator, an up/down counter and a digital loop filter, and wherein the phase/frequency detector is configured to initiate from the lowest possible clock frequency.

* * * * *